United States Patent [19]
Wingfield et al.

[11] Patent Number: 5,357,218
[45] Date of Patent: Oct. 18, 1994

[54] SELF-SHIELDING MICROSTRIP ASSEMBLY

[75] Inventors: William J. Wingfield, Lauderhill; Mark A. Crandall; Leng H. Ooi, both of Sunrise, all of Fla.

[73] Assignee: Motorola, Inc., Schaumburg, Ill.

[21] Appl. No.: 55,585

[22] Filed: May 3, 1993

[51] Int. Cl.$^5$ .................... H03B 5/18; H03B 7/12; H01P 7/08
[52] U.S. Cl. ........................... 331/96; 331/67; 331/107 SL; 333/219; 333/238; 333/246
[58] Field of Search ............ 331/67, 96, 107 SL, 331/187; 333/219, 220, 221, 238, 244, 246, 247; 361/397, 748, 760, 770, 783; 257/738, 777, 780

[56] References Cited
U.S. PATENT DOCUMENTS 5,110,664  5/1992  Nakanishi et al. .............. 361/397 X Primary Examiner—David Mis
Attorney, Agent, or Firm—Pedro P. Hernandez

[57] ABSTRACT

A shielded microstrip assembly (100) includes a substrate 102 having a first ground plane surface (106) and a second surface (206) which includes a transmission line (216). A plurality of solder balls (104) provide electrical interconnection for the ground plane and for the terminals (210) and (212) of transmission line (216). The microstrip assembly (100) is then inverted and attached using solder balls (104) to a carrier (302). The inverted microstrip assembly (100) of the present invention provides for improved shielding, while maintaining the high Q and other advantages associated with a microstrip.

14 Claims, 2 Drawing Sheets

5,357,218

SELF-SHIELDING MICROSTRIP ASSEMBLY

TECHNICAL FIELD

This invention relates in general to microstrip assemblies and more specifically to a microstrip assembly providing improved shielding characteristics.

BACKGROUND

Microstrip oscillator circuits typically exhibit a high degree of sensitivity to changes in the surrounding environment causing them to become microphonic. Because of the problem with microphonics and other types of interference, stripline resonators are often used instead of microstrip resonators when designing oscillator circuits since they are self-shielding due to their dual ground plane architecture. The tradeoffs the designer faces when choosing a stripline rather than a microstrip are lower Q and higher capacitance. The lower Q and higher capacitance exhibited by the stripline causes the tuning range of the oscillator circuit incorporating the stripline to be reduced, as compared to when using a microstrip resonator. A need thus exists for a microstrip structure which retains the higher Q's associated with microstrip structures and provides the additional shielding against interference and microphonics found in stripline structures.

DETAILED DESCRIPTION OF THE PREFERRED EMBODIMENT

Figure 1:
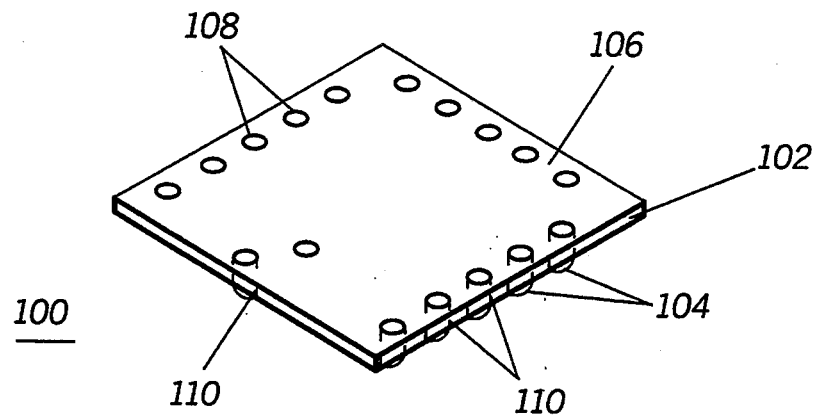
FIG. 1 shows a top view of a microstrip assembly in accordance with the present invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a top view of a microstrip assembly 100 in accordance with the present invention is shown. Microstrip assembly 100 comprises a substrate 102 having a first major surface 106 which is metallized to form a conductive plane. Conductive plane 106 is electrically coupled to ground potential when microstrip 100 is placed in use in order to form the microstrip and therefor will also be referred to as a ground plane. Substrate 102 can be formed from many well known substrate materials, in the preferred embodiment substrate 102 is formed from a ceramic such as Alumina. A plurality of metallized vias 110 which make electrical contact with ground plane 106 at contact points 108, traverse the width of substrate 102 and end up on the bottom surface of substrate 102. Metallized vias 110 simply make contact with the metallization pattern forming ground plane 106 at contact points 108 (no apertures are formed on ground plane 106 by vias 110). A plurality of solder balls 104 are attached to solder pads on the bottom surface which make electrical interconnection to vias 110. The solder balls are attached using a process known as controlled collapsible chip carrier connections (also known as "C4"), a process which is well known in the art. Solder balls 104 allow for the interconnection of microstrip assembly 100 onto another substrate (carrier) in an inverted orientation (ground plane 106 on top, and the interconnections occurring on the transmission line side.

Figure 2:
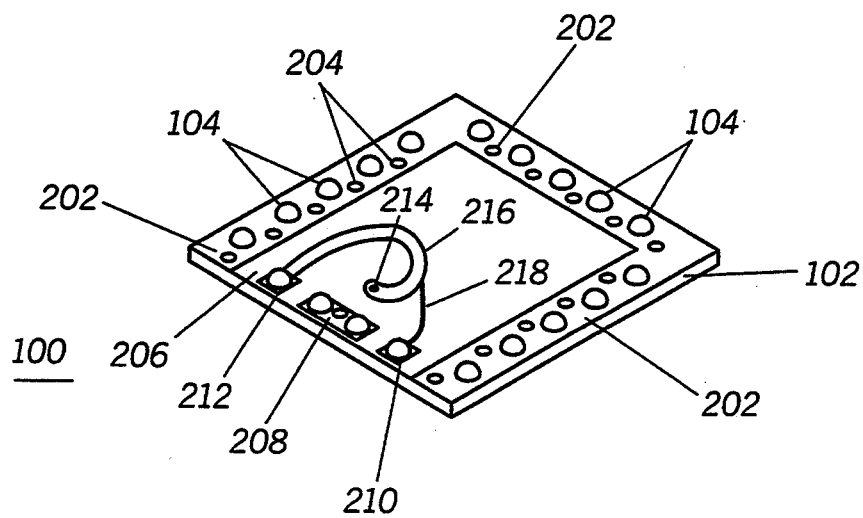
FIG. 2 shows a bottom view of the microstrip assembly of FIG. 1.

In FIG. 2, the second major surface 206 of microstrip assembly 100 is shown. Second major surface 206 is opposed to first major surface 106. A metallized ground strip 202 substantially encircles transmission line 216, and is disposed around the perimeter of second surface 206 on three of its sides (portion 202) and a portion of the fourth (208). Vias 110 which make electrical contact with ground plane 106 also make electrical contact with ground plane 202 at selected locations which terminate in solder pads. Solder balls 104 are in turn attached to the solder pad locations on ground strip 202. The solder balls allow for microstrip assembly 100 to be later soldered (reflowed) to an electronic carrier, such as the rest of an oscillator circuit, as will be described later. Some of the solder balls connect with ground potential and the others solder balls connect the transmission line terminals (210 and 212) to the rest of the oscillator circuit, or other types of electronic circuitry which microstrip 100 is connected, such as a filter circuit, etc.

Located in the area defined by ground strip 202 on surface 206, a conductive line 216 helps to form a microstrip resonator. One end of conductive line 216 is attached to solder pad 206. A solder ball is attached to pad 206 for interconnection of conductive line 216. The other end (shorted end) of conductive line 216 is connected to ground plane 106 by metallized via 214. Conductive line 216 is selectively tapped by runner 218 at a selected point in along its length, depending on the design. The other end of runner 218 is connected to solder pad 210. A "C4" solder ball 104 is also attached to solder pad 210 which provides interconnection of the tapped end of the transmission line (resonator).

Figure 3:
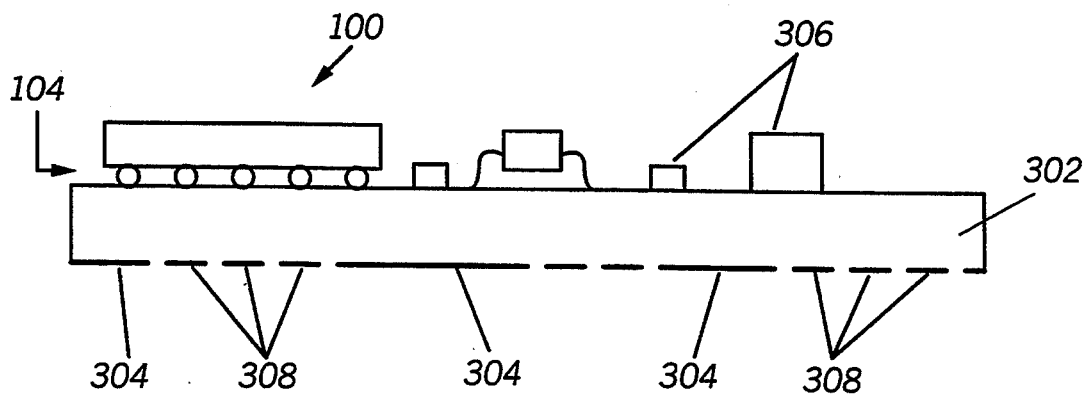
FIG. 3 shows an electronic assembly using the microstrip assembly of the present invention.

Referring to FIG. 3, an electronic assembly such as a VCO assembly is shown. The VCO assembly includes a substrate 302 having an electronic component surface which includes a plurality of electronic components 306 which make up the bulk of the oscillator circuit. Also included on the electronic component surface is microstrip assembly 100. The bottom surface of the VCO assembly is substantially covered by a ground plane 304. A plurality of interconnect pads 308 are provided on this surface for interconnecting the input and output ports of the VCO and for providing biasing voltages as required to the circuit when the oscillator circuit as attached to another carrier such as the main printed circuit board of a radio.

Inverted microstrip assembly 100 is soldered to VCO substrate 302 in order to help reduce the sensitivity of microstrip 100 to external interference and microphonics. By inverting microstrip assembly 100 and maintaining an air gap between surface 206 of microstrip assembly 100 and the component surface of substrate 302, enhanced shielding is achieved for the microstrip resonator 100. By maintaining an air gap between microstrip 100 and substrate 302, the high Q benefits of the microstrip structure are maintained. The size of the air gap between the two surfaces is determined by the diameter of solder balls 104 and the size of the solder pads on substrate 302 which the solder balls are attached. Solder balls 104 act as a spacer means between microstrip 100, and substrate 302, which acts as a carrier for the microstrip. The diameter of solder balls 104 and the size of the interconnection pads on substrate 302 which the balls are soldered to will determine how much space is left between microstrip 100 and the component surface of carrier 302, once solder balls 104 are reflowed.

In the preferred embodiment, carrier 302 was 0.006 inch thick, substrate 102 was 0.004 inch thick, and solder balls provided a height between second surface 206 of substrate 102 and the electronic component surface of carrier 302 of 0.002 inch, after the solder balls had been reflowed.

Those skilled in the art will understand that factors such as the dielectric constants and thicknesses of substrate 102 and carrier 302, and the height (air gap) between substrate 102 and carrier 302 will determine the eventual Q, capacitance, and shielding capability which are experienced by microstrip 100.

Figure 4:
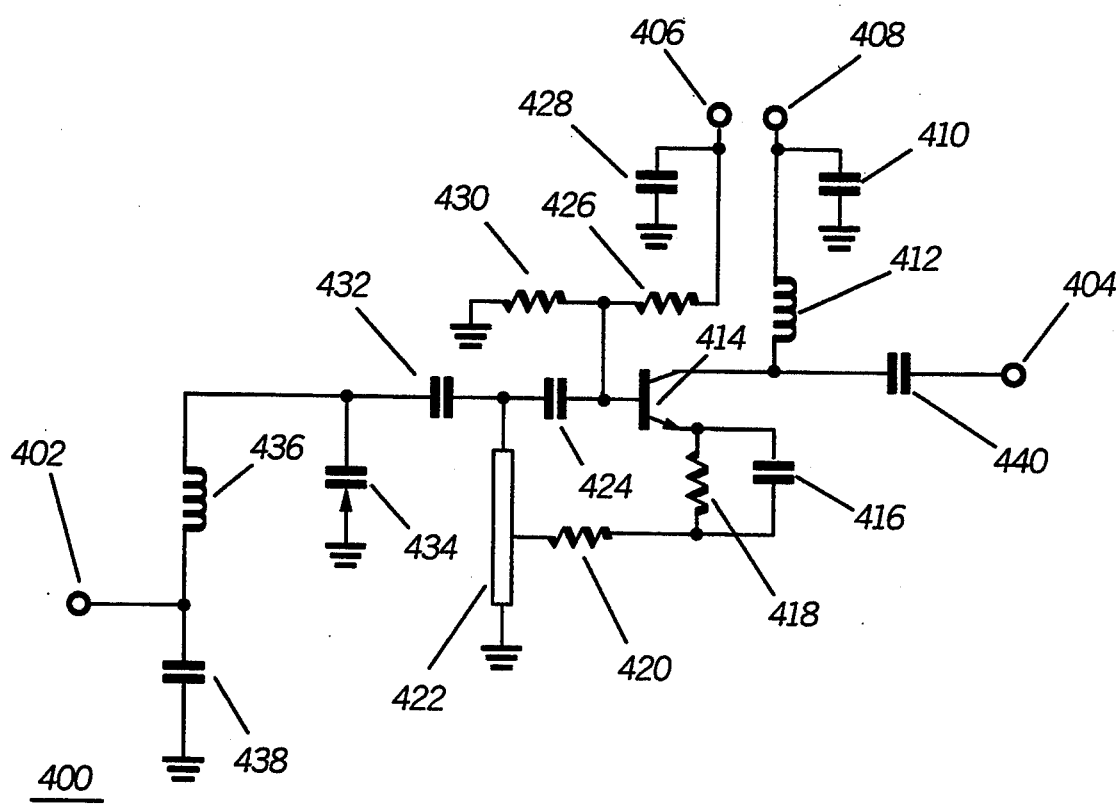
FIG. 4 is a schematic of a voltage-controlled-oscillator (VCO) in accordance with the present invention.

Referring to FIG. 4, there is shown a voltage-controlled-oscillator (VCO) in accordance with the present invention. VCO 400 is typically used as part of a phase-lock-loop (PLL) synthesizer for use in communication equipment. VCO 400 includes a control voltage input port 402 for receiving a control voltage signal. In a typical radio application, input port 402 receives the control voltage from a portion of the synthesizer. Connected to input port 402 is a capacitor 438 coupled to ground and a series inductor 436. The other end of inductor 436 is connected to variable capacitor 434. A series capacitor 432 couples variable capacitor 434 to tapped resonator element 422 which has one end coupled to ground. Tapped resonator element 422 is a shielded microstrip assembly as shown in FIGS. 1 and 2. Oscillator 400 includes an RF amplifier such as NPN transistor 414. The other end of tapped resonator 422 is capacitively coupled via capacitor 424 to the base of NPN transistor 414.

Tapped resonator 422 is selectively tapped depending on the required operating parameters of oscillator 400 by one end of resistor 420. The other end is connected to a resistor 418 and inductor 416 which are in parallel to each other and their other ends are connected to the emitter of transistor 414. Also included as part of oscillator 400 is inductor 412, which is coupled between B+ voltage terminal 408 and the collector of transistor 414. Also coupled to the collector of transistor 414 is a coupling capacitor 440 which is connected between the collector of transistor 414 and output port 404. A capacitor 410 is coupled between B+ port 408 and ground potential. A biasing circuit coupled to base bias voltage terminal 406 is comprised of resistors 426 and 430 and capacitor 428 provide biasing to transistor 414. Resistors 426 and 430 form a voltage divider circuit which sets the base bias voltage for transistor 414. The grounded end of resonator 422 relates to grounded end 212, in FIG. 2. Tapped terminal 210 in FIG. 2, relates to the tapped end which is connected to resistor 420, in FIG. 4. While the other end of resonator 422 which is connected to capacitors 432 and 424, relates to terminal 212, in FIG. 2.

Figure 5:
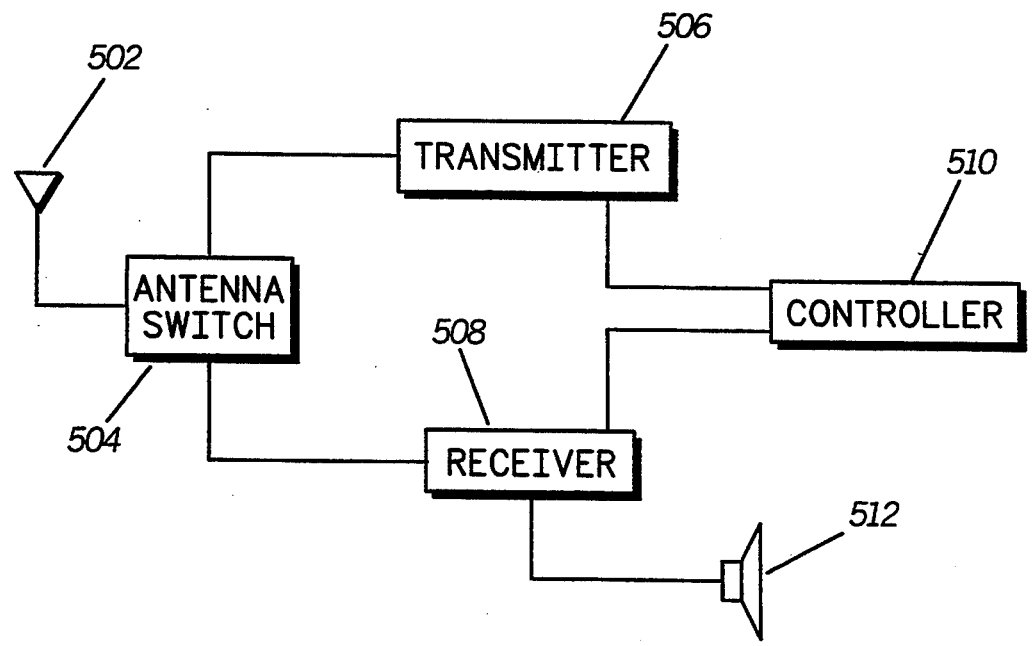
FIG. 5 shows a block diagram of a radio in accordance with the present invention.

In FIG. 5, a block diagram of a radio in accordance with the present invention is shown. The radio comprises an antenna 502 selectively coupled by an antenna switch 504 between a transmitter 506 and a receiver 508. Both transmitter 506 and receiver 508 are conventional radio frequency devices as known in the art except that the radio includes a VCO 400 as shown in FIG. 4. A controller 510 such as a microprocessor like a MC68HC11 manufactured by Motorola, Inc. having built-in memory and input/output (I/O) capabilities controls the operation of the radio. A speaker 512 is coupled to receiver 508 for providing audio information to the radio user.

In summary, the present invention provides for an inverted microstrip assembly which has the shielding characteristics of a stripline while maintaining the higher Q's and lower capacitance of a microstrip. By inverting microstrip assembly 100 and providing an air gap the assembly and the substrate the assembly is mounted to allows for enhanced shielding and higher Q's and still provide for the enhanced shielding characteristics associated with a stripline. Although in the preferred embodiment, the air gap between microstrip 100 and substrate 302 was provided by solder balls 104, other methods for providing interconnection from microstrip 100 to substrate 302 and still allow for an air gap are available. For example, substrate 102 can have raised walls about the perimeter of surface 206 which can provide for interconnection and allow for the microstrip resonator or filter to be raised above substrate 302 a certain height.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A microstrip assembly for attachment to a carrier, comprising:
   a substrate having first and second opposed major surfaces;
   a ground plane disposed on the first major surface;
   a transmission line disposed on the second major surface;
   at least two interconnection terminals disposed on the second major surface, at least one of said at least two interconnection terminals electrically coupled to the ground plane and the other of said at least two interconnection terminals is electrically coupled to the transmission line; and
   spacer means located between the second major surface of the substrate and the carrier for providing an air gap between the second surface of the substrate and said carrier upon the microstrip assembly being attached to said carrier, the air gap providing for the transmission line to exhibit an increase in Q value.

2. A microstrip assembly as defined in claim 1, wherein the spacer means comprises solder balls which are soldered to the at least two interconnection terminals.

3. A microstrip assembly as defined in claim 2, further comprising:
   a ground plane strip disposed on the second major surface of the substrate and substantially encircling the transmission line, the ground plane strip is electrically coupled to the ground plane.

4. A microstrip assembly as defined in claim 3, wherein the substrate is comprised of a ceramic material.

5. A microstrip assembly as defined in claim 2, wherein the solder balls have a predetermined diameter which allows for a substantial portion of the second major surface of the substrate to rest a predetermined height above the carrier.

6. An electronic assembly, comprising: a microstrip assembly, comprising:
- a substrate having first and second major opposed surfaces;
- a ground plane disposed on the first major surface;
- a transmission line disposed on the second major surface;
- at least two interconnection terminals disposed on the second major surface, at least one of said at least two interconnection terminals electrically coupled to the ground plane and the other of said at least two interconnection terminals electrically coupled to the transmission line; and
- at least two solder balls attached one each to the at least two interconnection terminals; and
- a carrier having first and second surfaces, the first surface having at least two interconnection pads; and
- the at least two solder balls found on the microstrip assembly are soldered one each onto the at least two interconnection pads on the carrier providing for an air gap between the substrate and the carrier which allows for for the microstrip assembly to exhibit an increase in Q value.

7. An electronic assembly as defined in claim 6, wherein the at least two solder balls have a have a predetermined diameter which allows for the microstrip assembly to rest a predetermined height above the carrier's first surface.

8. An electronic assembly as defined in claim 6, further comprising:
- a ground plane strip disposed on the second major surface of the microstrip assembly and substantially encircling the transmission line, the ground plane strip is electrically coupled to the ground plane.

9. An electronic assembly as defined in claim 6, wherein the electronic assembly comprises a voltage-controlled-oscillator (VCO).

10. An electronic assembly as defined in claim 7, wherein the substrate is comprised of a ceramic material.

11. A communication device, comprising:
- a receiver; and
- an oscillator coupled to the receiver, the oscillator comprising:
  - a microstrip assembly, comprising:
    - a substrate having first and second major opposed surfaces;
    - a ground plane disposed on the first major surface;
    - a transmission line resonator disposed on the second major surface;
    - at least two interconnection terminals disposed on the second surface, at least one of said at least two interconnection terminals electrically coupled to the ground plane and the other of said at least two interconnection terminals electrically coupled to the transmission line resonator; and
    - at least two solder balls attached one each to the at least two interconnection terminals; and
  - a carrier having first and second surfaces, the first surface having at least two interconnection pads; and
  - the at least two solder balls found on the microstrip assembly are soldered one each onto the at least two interconnection pads on the carrier providing for an air gap between the substrate and the carrier which allows for the transmission line resonator to exhibit an increase in Q value.

12. A communication device as defined in claim 11, wherein the at least two solder balls have a have a predetermined diameter which allows for the microstrip assembly to rest a predetermined height above the carrier's first surface.

13. A communication device as defined in claim 11, further comprising:
- a ground plane strip disposed on the second major surface of the microstrip assembly and substantially encircling the transmission line, the ground plane strip is electrically coupled to the ground plane.

14. A communication device as defined in claim 12, wherein the substrate is comprised of a ceramic material.

* * * * *